(12) United States Patent
Ishida et al.

(10) Patent No.: US 12,000,790 B2
(45) Date of Patent: Jun. 4, 2024

(54) PHYSICAL PROPERTY EVALUATION DEVICE

(71) Applicant: NEC Corporation, Tokyo (JP)

(72) Inventors: Masahiko Ishida, Tokyo (JP); Ryohto Sawada, Tokyo (JP); Yuma Iwasaki, Tokyo (JP); Akihiro Kirihara, Tokyo (JP); Hiroko Someya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 630 days.

(21) Appl. No.: 17/265,657

(22) PCT Filed: Aug. 5, 2019

(86) PCT No.: PCT/JP2019/030628
§ 371 (c)(1),
(2) Date: Feb. 3, 2021

(87) PCT Pub. No.: WO2020/031930
PCT Pub. Date: Feb. 13, 2020

(65) Prior Publication Data
US 2021/0302343 A1    Sep. 30, 2021

(30) Foreign Application Priority Data
Aug. 7, 2018    (JP) .................................. 2018-148127

(51) Int. Cl.
*G01N 25/48* (2006.01)
*H10N 15/20* (2023.01)
(52) U.S. Cl.
CPC ........... *G01N 25/482* (2013.01); *H10N 15/20* (2023.02)
(58) Field of Classification Search
CPC .............................. G01N 25/482; H10N 15/20
See application file for complete search history.

(56) References Cited

U.S. PATENT DOCUMENTS

| 10,088,439 | B2 * | 10/2018 | Amagai | ................. G01N 25/18 |
| 2018/0033940 | A1 | 2/2018 | Kirihara et al. | |
| 2020/0313062 | A1 * | 10/2020 | Iwasaki | ................... H01L 29/82 |

FOREIGN PATENT DOCUMENTS

| CN | 107328808 A | 11/2017 |
| JP | H07-294541 A | 11/1995 |

(Continued)

OTHER PUBLICATIONS

Japanese Office Action for JP Application No. 2020-535745 dated Mar. 8, 2022 with English Translation.

(Continued)

*Primary Examiner* — Mirellys Jagan
(74) *Attorney, Agent, or Firm* — Sughrue Mion, PLLC

(57) ABSTRACT

This invention prevents measurement error from becoming large in thermoelectric conversion coefficient evaluation and enhances evaluation efficiency. This invention is a physical property evaluation device for evaluating the physical properties of a plurality of solid materials formed on a substrate. The physical property evaluation device comprises an electromotive force measurement means that forms closed circuits including the individual solid materials and measures the electromotive forces occurring at the two ends of each of the solid materials, a means for producing heat flow within the individual solid materials, an external magnetic field generation means for generating a uniform magnetic field having a given intensity and direction in the vicinity of the individual solid materials, and an automation means for evaluating the physical properties of the individual solid materials using the electromotive force measurement means, heat flow production means, and external magnetic field generation means.

16 Claims, 13 Drawing Sheets

(56) References Cited

FOREIGN PATENT DOCUMENTS

| | | |
|---|---|---|
| JP | H09-222403 A | 8/1997 |
| JP | 2008-170259 A | 7/2008 |
| JP | 2017-191066 A | 10/2017 |
| WO | 2016/136190 A1 | 9/2016 |

OTHER PUBLICATIONS

International Search Report for PCT Application No. PCT/JP2019/030628, dated Oct. 21, 2019.
English translation of Written opinion for PCT Application No. PCT/JP2019/030628, dated Oct. 21, 2019.
K. Uchida et. al., "Thermal spin pumping and magnon-phonon-mediated spin-Seebeck effect" Journal of Applied Physics 111, 103903 (2012).

* cited by examiner

PHYSICAL PROPERTY EVALUATION DEVICE

This application is a National Stage Entry of PCT/JP2019/030628 filed on Aug. 5, 2019, which claims priority from Japanese Patent Application 2018-148127 filed on Aug. 7, 2018, the contents of all of which are incorporated herein by reference, in their entirety.

TECHNICAL FIELD

The present invention relates to a physical property evaluation device, and mainly relates to a physical property evaluation device that evaluates a thermoelectric conversion coefficient of a thermoelectric conversion material being a solid material for converting a heat flow and an electric current to each other.

BACKGROUND ART

In order to evaluate a thermoelectric conversion coefficient of a solid material that exhibits a thermoelectric conversion effect, it is necessary to measure an output voltage of the solid material in a state in which a specified temperature difference is given thereto.

In FIG. 3 in a technique described in Non-Patent Literature 1 (NPL1), a first heat reservoir being stabilized at a first temperature is prepared in order to set one end of a solid material to a certain temperature, a second heat reservoir being stabilized at a second temperature is prepared in order to set another end of the solid material to a temperature different from the first temperature, and the first and second heat reservoirs are brought into contact with the both ends of the solid material, whereby a temperature difference is caused.

CITATION LIST

Patent Literature

[NPL1] K. Uchida et. al., "Thermal spin pumping and magnon-phonon-mediated spin-Seebeck effect" Journal of Applied Physics 111, 103903 (2012).

SUMMARY OF INVENTION

Technical Problem

However, there has been a problem that temperature gaps occur on interfaces between the heat reservoirs and the solid material, and large fluctuation of the temperature gaps during measurement becomes a large error factor of a temperature difference in the solid material, and makes it extremely difficult to accurately evaluate the thermoelectric conversion coefficient.

In other words, when surfaces of high-temperature/low-temperature blocks and surfaces of elements, each of which has minute irregularities, are thrust against each other, then air gaps are generated, heat transfer therebetween is inhibited, and accordingly, temperature gaps occur, and a degree of the temperature gaps changes every time depending on a situation in which both of the surfaces are bonded to each other. This means that a measurement error increases.

Moreover, in the evaluation of the thermoelectric conversion coefficient, since an operator has been basically required to set and measure each sample, efficiency increase of measurement work has been another large problem when it is considered to evaluate a large number of samples.

An object of the present invention is to provide a physical property evaluation device that solves the problems mentioned above, prevents a measurement error from increasing in evaluation of a thermoelectric conversion coefficient, and in addition, also enhances evaluation efficiency.

Solution to Problem

According to the present invention, there is provided a physical property evaluation device that evaluates physical properties of a plurality of solid materials being formed on a substrate, the device comprising:
  an electromotive force measurement means for forming a closed circuit including each of the solid materials, and measuring electromotive force being generated on both ends of the solid material;
  a means for generating a heat flow in each of the solid materials;
  an external magnetic field generation means for generating a uniform magnetic field in a vicinity of each of the solid materials, the magnetic field having a given intensity and direction; and
  an automation means for evaluating a physical property of each of the solid materials by using the electromotive force measurement means, the heat flow generation means, and the external magnetic field generation means.

Advantageous Effects of Invention

According to the present invention, the measurement error is able to be prevented from increasing in the evaluation of the thermoelectric conversion coefficient, and in addition, the evaluation efficiency is also able to be improved.

EXAMPLE EMBODIMENTS

A detailed description will be given below of an evaluation device of a thermoelectric conversion effect according to example embodiments of the present invention and a configuration thereof, with reference to drawings. The example embodiments to be described below are subjected to technically preferable limitations in order to embody the present invention; however, do not limit the scope of the invention to the followings.

First Example Embodiment

First, referring to FIGS. 1 to 9, a description will be given of the configuration of the evaluation device of a thermoelectric conversion effect according to a first example embodiment.

Figure 1:
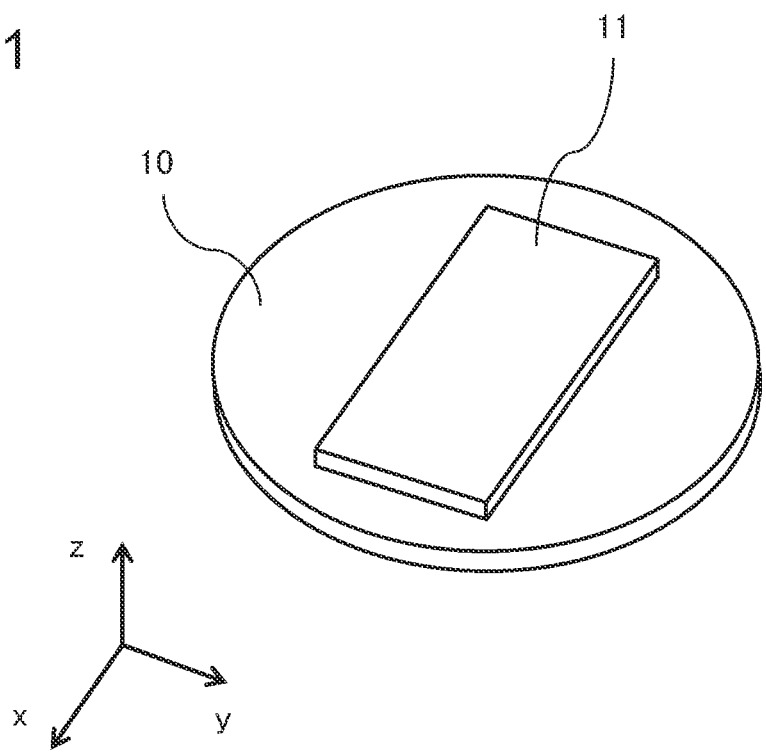
FIG. 1 is a schematic diagram illustrating arrangement of a substrate for use in a thermoelectric conversion effect evaluation system according to a first example embodiment of the present invention and a solid material as a measurement target.

FIG. 1 is a schematic diagram illustrating arrangement of a substrate for use in the evaluation device of a thermoelectric conversion effect according to the first example embodiment of the present invention and of a solid material as a measurement target. A description will be first given of a method of manufacturing a measuring element structure including a permalloy thin film as a solid material.

A substrate 10 is made of silicon with a plane orientation (100), on the surface of which a thermal oxide film with a thickness of 40 nm is formed. On the substrate, a permalloy ($Ni_{78}Fe_{22}$) thin film 11 with a thickness of 100 nm is deposited by using a sputtering deposition method. At this time, the permalloy thin film 11 is shaped to a size of 2 mm×4 mm by using a stencil pattern.

Figure 2:
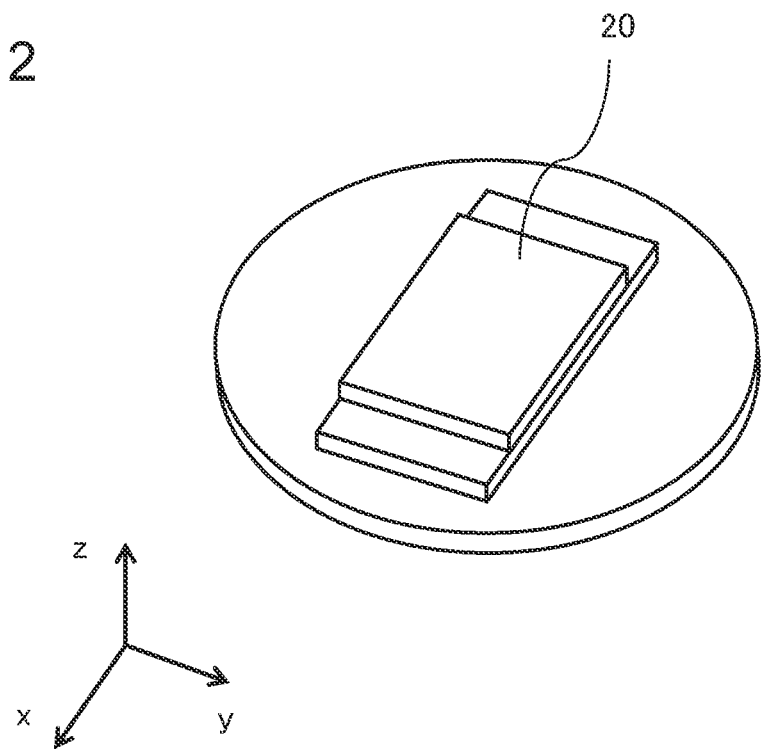
FIG. 2 is a schematic diagram illustrating arrangement of an insulating coating film formed on the solid material of FIG. 1.

Moreover, an insulating coating film 20 that is made of silicon oxide and deposited by a sputtering method in such a way as to cover the permalloy thin film 11 of FIG. 1 is arranged by using a stencil pattern as illustrated in FIG. 2. A film thickness of the silicon oxide is set to 100 nm.

Figure 3:
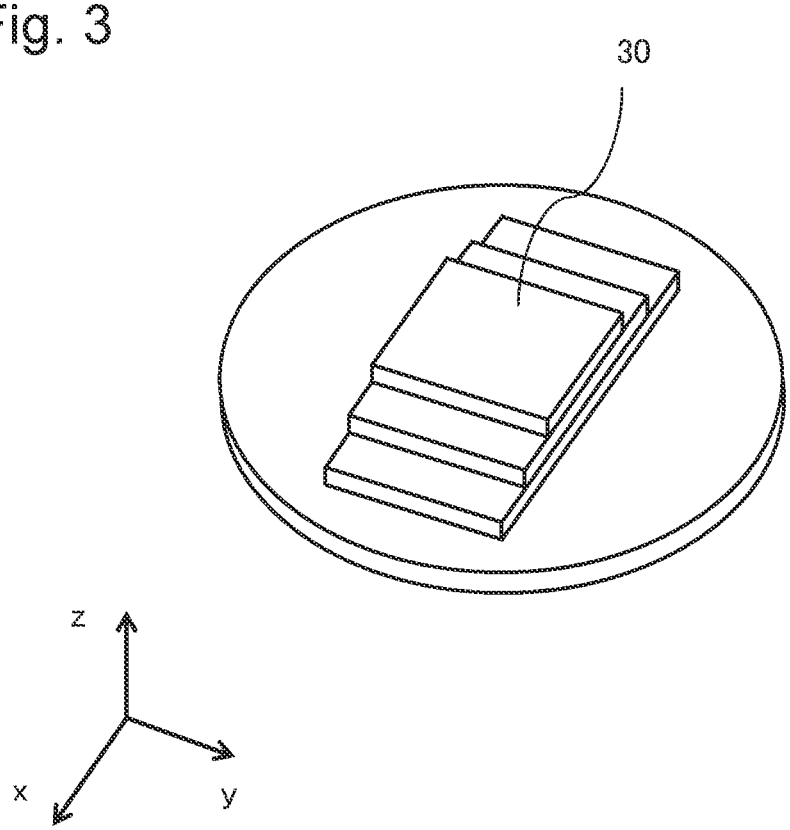
FIG. 3 is a schematic diagram illustrating arrangement of a heating element film formed on the insulating coating film of FIG. 2.

Finally, as illustrated in FIG. 3, a heating element film 30 that is composed of a multi-layered film of titanium/platinum and is generated by using the sputtering method in the same way is formed as a heating element on the insulating coating film 20 by using a stencil pattern while leaving both ends of the insulating coating film 20. Film thicknesses of the titanium and the platinum in the multi-layered film are 5 nm and 95 nm, respectively, and the titanium and the platinum are multi-layered on each other in this order. Thus, a measuring element structure including the permalloy thin film 11 as a solid material is obtained.

Subsequently, a description will be given of a measurement method using a thermoelectric conversion effect evaluation system 40 illustrated in FIG. 4. First, a substrate 41 on which the measuring element structure fabricated through the above-described process is generated is fixed onto a substrate stage 42. The substrate stage 42 can move a position of the substrate 41 in illustrated xy-directions by a movable mechanism 43. Immediately below the substrate stage 42, an electromagnet system 44 is provided for the purpose of applying a magnetic field to the permalloy thin film 11 in an in-plane direction thereof. According to needs of measurement, the electromagnet system 44 can be replaced by a type of applying a magnetic field in in-plane biaxial directions (xy-directions in FIG. 4), a type of applying a magnetic field in a plane-perpendicular direction (z-direction in FIG. 4), or the like. Though not illustrated in FIG. 4, the electromagnet system 44 includes an excitation power supply and a magnetic field sensor that refers to a leakage magnetic field in order to estimate a magnetic field intensity. A combination of the electromagnet body, the excitation power supply, and the magnetic field sensor in the electromagnet system 44 is defined as an external magnetic field generation means.

Immediately above the substrate 41, a contact probe system 45 provided in order to introduce a heating element current, to measure thermal electromotive force, and the like is fixed onto a probe stage 46. The probe stage 46 can move up and down in the z-direction by a movable mechanism 47.

Figure 5:
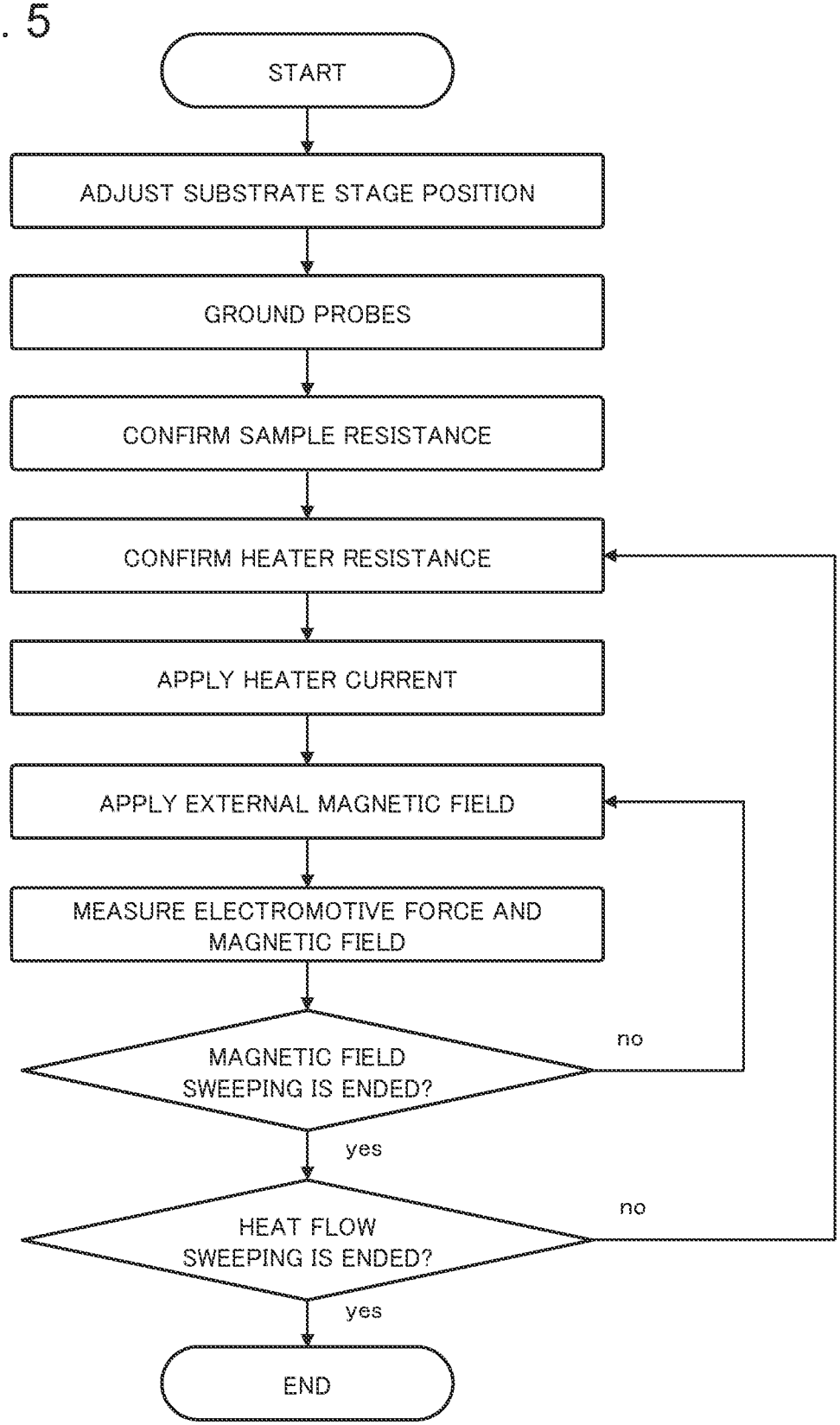
FIG. 5 is a flowchart illustrating a flow of a measurement process by the thermoelectric conversion effect evaluation system according to the first example embodiment of the present invention.

A thermoelectric effect is evaluated along a flowchart illustrated in FIG. 5. After the substrate 41 is first fixed to the substrate stage 42, a position thereof is adjusted by using the movable mechanism 43 of the stage, and for example, the substrate 41 is arranged at the center of a magnetic field generated by the electromagnet system 44.

Subsequently, each probe of the contact probe system 45 is positionally adjusted by using position adjustment mechanisms of the probes themselves and the movable mechanism 47 of the probe stage in such a way that the probes are appropriately arranged individually on the heating element film and contact pads. As a result of the positional adjustment, the probes are grounded to the element on the substrate, i.e., are electrically connected thereto.

Each of the movable mechanisms which perform a series of operations from fixing the substrate to grounding probe tips to the element is controllable by a computer, and further, it is also possible to automatically perform the series of operations. A combination of the movable mechanism and the controlling computer, which also includes controlling software, is defined as an automation means.

The fact that the probes are grounded to the element on the substrate is confirmed by confirming a resistance between the contact pads and a resistance of the heating element. A resistance measurement function that connects to the contact pads is provided with a function as a constant current source and functions as an ammeter and a voltmeter, and is positioned as a means (measurement means) for measuring electromotive force generated on both ends of the solid material. Moreover, a resistance measurement function that connects to the heating element is also provided with a function as a constant current source and functions of an ammeter and a voltmeter. All including the heating element, the current source, and other electricity measurement functions are defined as a means (heat flow generation means) for generating a heat flow in the solid material. Among them, the heating element and the other functions are appropriately separable from each other. Moreover, the measurement means and the heat flow generation means can form closed circuits electrically independent of each other.

Subsequently, a constant current is applied to the heating element, and further, an external magnetic field is applied thereto by the electromagnet system 44. In this state, an open-circuit voltage generated between the contact pads, strength of the external magnetic field, and the like are measured, whereby data of the thermal electromotive force in a state of being applied with a specific heat flow and the external magnetic field can be acquired.

Figure 6:
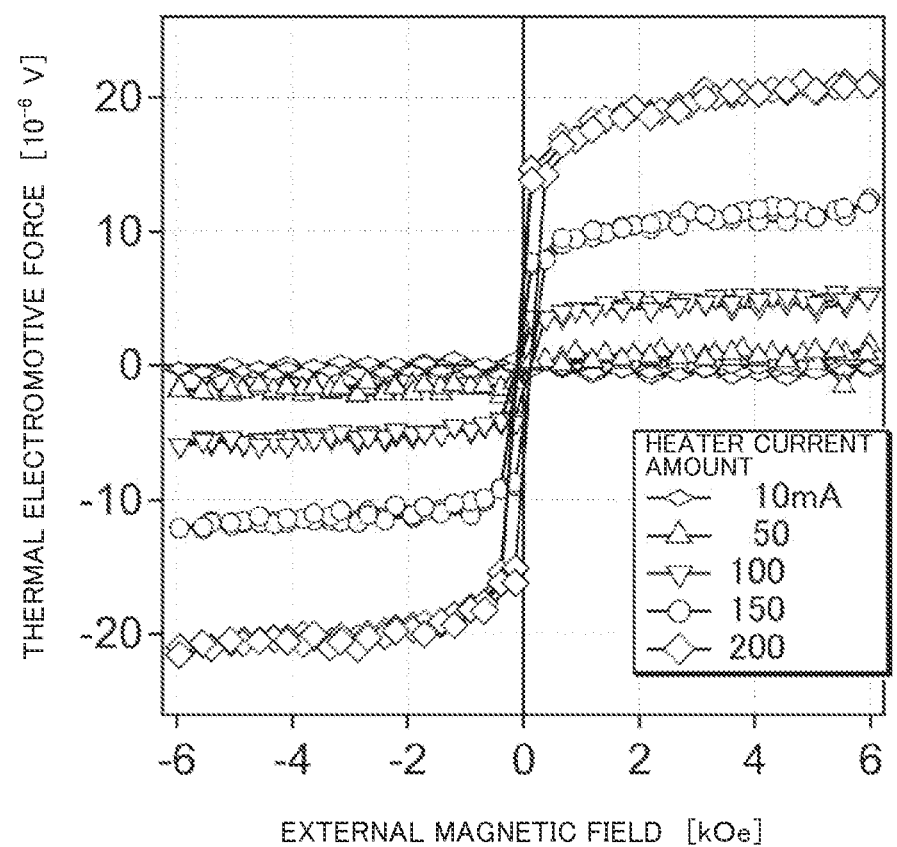
FIG. 6 is plots illustrating results of evaluating anomalous Nernst effects in the thermoelectric conversion effect evaluation system according to the first example embodiment of the present invention.

Then, the measurement is repeated according to a list of applied values of the current and the external magnetic field, which is prepared in advance, whereby profiles of the external magnetic field dependence property and the applied current dependence property of the thermal electromotive force as illustrated in FIG. 6 can be acquired.

The above-described configuration measures thermoelectric effects which occur in magnetic semiconductors and conductors and mainly result from the anomalous Nernst effect.

Figure 7:
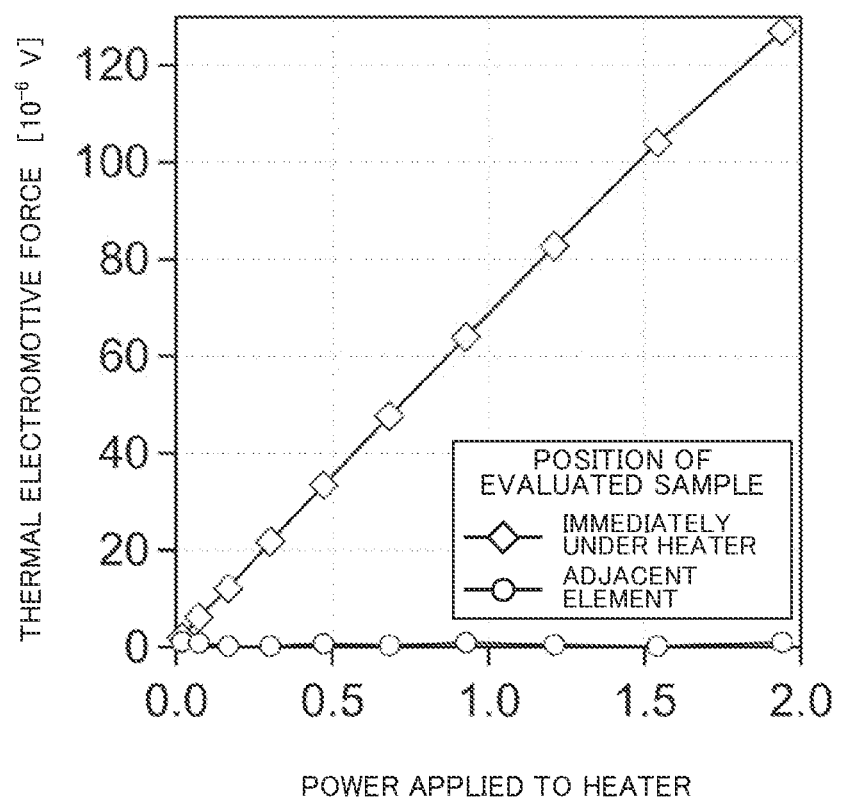
FIG. 7 is plots illustrating results of measuring thermal electromotive forces obtained depending on heating element power in thermoelectric conversion effect evaluation system according to the first example embodiment of the present invention.

Subsequently, in order to confirm validity of the evaluation by the above-described configuration, a magnitude of the thermal electromotive force that depends on heating element power was confirmed. FIG. 7 is a result of redefining, as thermal electromotive forces, and plotting half values of amplitudes of profiles in which a horizontal axis is power applied to the heating element and a vertical axis is the thermal electromotive force with respect to the external magnetic field of FIG. 6. The applied current to the heating element was changed from 0 to 500 mA. From the results of FIG. 7, the thermal electromotive force increases linearly up to 500 mA. From this fact, it can be estimated that, with regard to an amount of heat generated in the heating element, an amount thereof dissipated into air due to radiation and convection and dissipated in the in-plane direction of the film due to heat conduction is extremely small, and almost all amount thereof passes through the solid material and is dispersed toward the substrate side.

In FIG. 7, results of measuring thermal electromotive force of a dummy element that is arranged adjacent to the element as an evaluation target located immediately under the heating element are also plotted, where it is seen that none of the thermal electromotive force is generated.

This means the following. Since an applied amount of the heat flow to the solid material can be accurately estimated as a heat flux Q [W/m 2] from power applied to the heating element and a size of the heating element, a temperature difference generated in the film can be accurately estimated if thermal conductivity of the permalloy thin film and the thickness thereof are used as measurement parameters, and eventually, a thermoelectric conversion coefficient of the solid material can be estimated.

Figure 8:
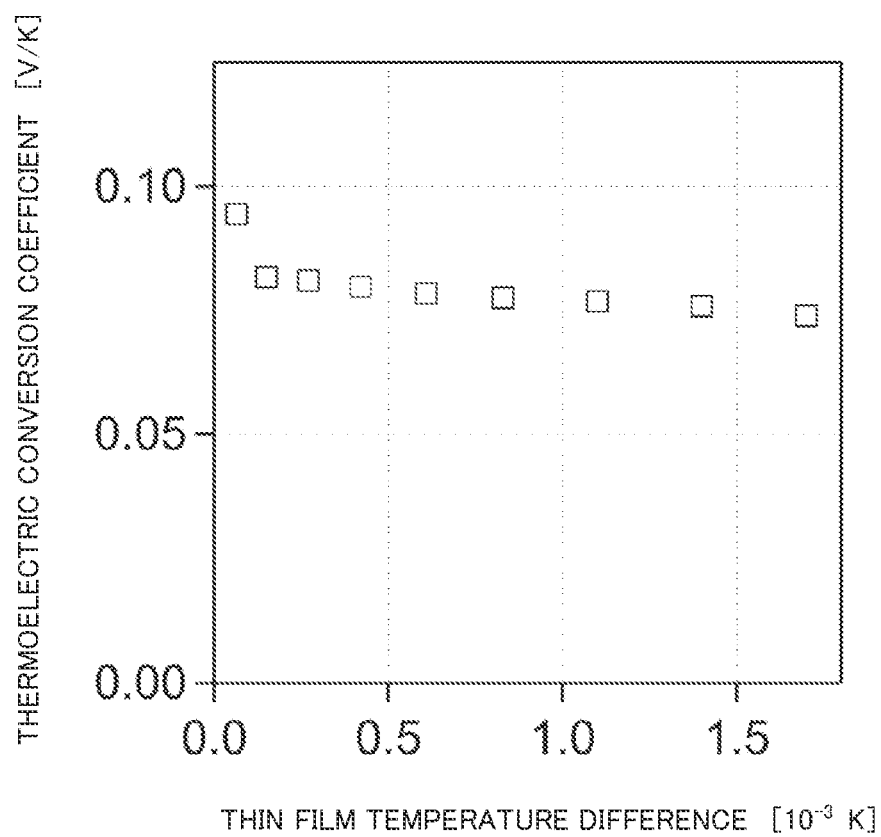
FIG. 8 is plots illustrating results of evaluating a thermoelectric conversion coefficient in the thermoelectric conversion effect evaluation system according to the first example embodiment of the present invention.
Figure 9:
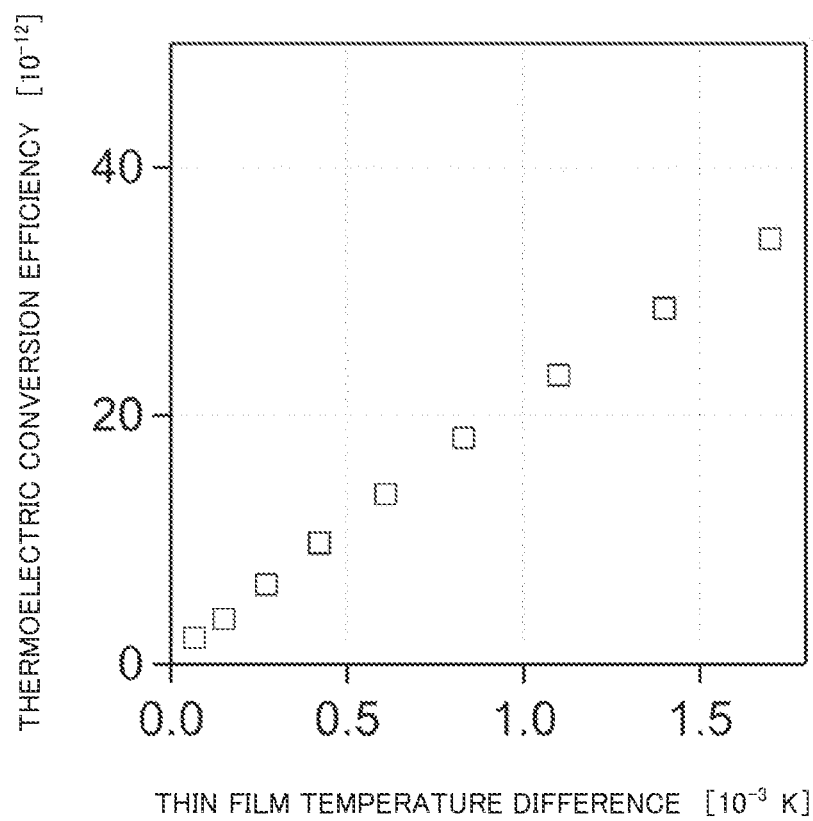
FIG. 9 is plots illustrating results of evaluating a thermoelectric conversion efficiency in the thermoelectric conversion effect evaluation system according to the first example embodiment of the present invention.

FIG. 8 illustrates plots of the thermoelectric conversion coefficient actually measured, and FIG. 9 illustrates plots of thermoelectric conversion efficiency estimated from an amount of power generated. Each of horizontal axes is the temperature difference that occurs in the thin film, where an order is 1 [mK]. The thermal electromotive force is approximately 0.07 [V/K], which is substantially constant, and such a tendency is observed that the thermoelectric conversion efficiency increases theoretically depending on the temperature difference. The thermoelectric conversion efficiency has an extremely small value with an order of $10^{-11}$, which is a sufficiently reasonable value in consideration that the sample is a thin film with a thickness of approximately 100 nm, and that the temperature difference applied thereto is extremely small.

As mentioned above, in the present example embodiment, the electromotive force generated in the solid material can be measured for the purpose of evaluating the thermoelectric conversion effect of the solid material, and particularly, the spin-Seebeck effect and the anomalous Nernst effect which occur in a magnetic material, and in addition, an inverse spin Hall effect, or the like which occur in relation to spin physical properties.

At this time, the sample that is made of the solid material and serves as a measurement target is characterized in being multi-layered on a substrate such as a glass plate and an oxide film-attached silicon wafer, which has a thin plate shape with high planarity and is easy to handle in a deposition device or the like. Moreover, the heating element for generating a heat flow in the solid material is arranged in such a way as to be multi-layered on the solid material with an insulating film interposed therebetween.

As a means for generating heat in the heating element, it is possible to use a variety of means such as Joule heating, radiation heating, heating by heat conduction, microwave heating, heating by thermoelectric effect, heating by chemical reaction, or the like, and it is also possible to perform negative heat generation by heat conduction and thermoelectric effect, i.e., heat absorption and cooling.

Since solids of the heating element and the sample are continuously joined to each other, a heat transfer coefficient defined on an interface therebetween ranges approximately from $10^6$ to $10^8$ [W/m²K], which is an almost ignorable value as a heat resistance component, where variations are necessarily very small.

In addition, it is possible to arrange a plurality of the samples on the substrate, and the plurality of samples can be collectively arranged through a series of steps of a film deposition process. At this time, it is also possible to generate the plurality of samples by effectively using the combinatorial deposition technique in such a way that blend compositions of materials, a shape such as thicknesses, and deposition process conditions such as temperatures are different among the plurality of samples.

In addition, it is also possible to arrange a plurality of the heating elements in such a way that the heating elements are matched with the samples in arrangement.

With regard to the measurement, it is possible to automatically perform all of the following according to a plan made in advance, all including: heating of the heating element; measurement of the electromotive force; up and down actions of the probes for heating and measuring the plurality of samples; planar actions of the probes or the substrate stage; and depending on the case, control of measurement environments such as an external magnetic field, an atmosphere, and an ambient temperature.

First Modified Example of First Example Embodiment

Subsequently, referring to FIGS. 10 to 12, a description will be given of a configuration of a first modified example of the thermoelectric conversion effect evaluation system according to the first example embodiment. This modified example relates to a method of fabricating an evaluating element structure with good yield by a simpler process and relates to the element structure. A description will be given of a method of manufacturing a measuring element structure including a permalloy thin film as a solid material.

Figure 10:
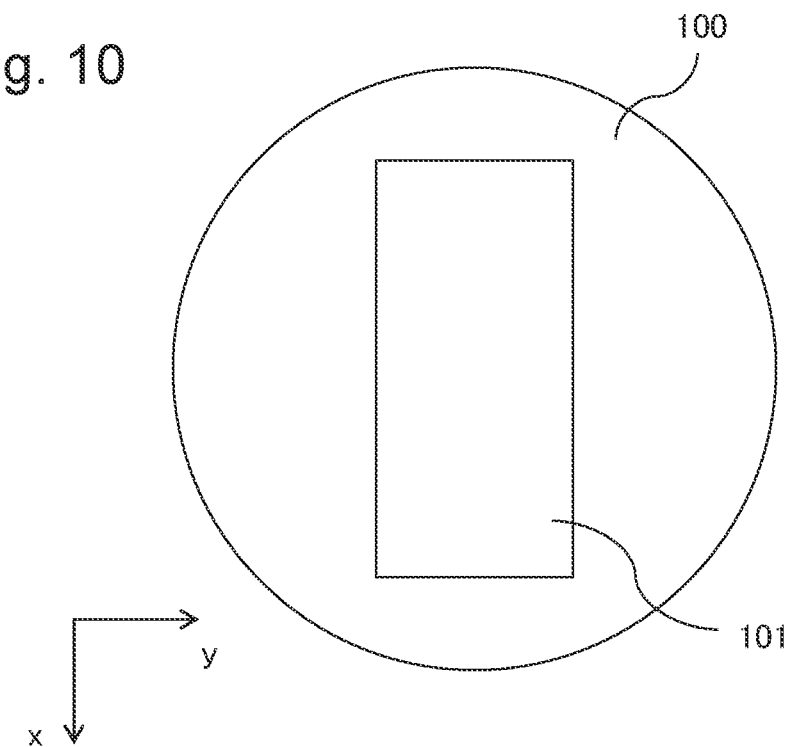
FIG. 10 is a schematic diagram illustrating arrangement of a substrate for use in a first modified example of the first example embodiment of the present invention and a solid material as a measurement target.

FIG. 10 is a schematic diagram illustrating arrangement of a substrate 100 for use in this modified example and a solid material 101 as a measurement target, in which an oxide film-attached silicon substrate and a permalloy thin film are used as in the first example embodiment.

Figure 11:
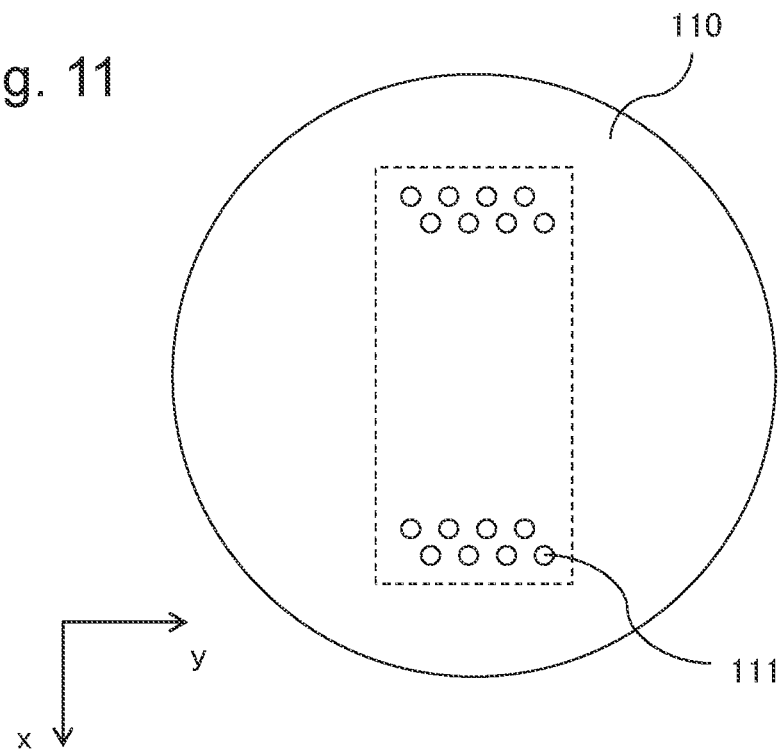
FIG. 11 is a schematic diagram illustrating an insulating coating film that entirely covers the substrate and the solid material of FIG. 10 and a contact hole structure arranged on the solid material.

Next, as illustrated in FIG. 11, on the entire surface of the substrate of FIG. 10, a silicon oxide coating film 110 fabricated by using a method called a metal organic decomposition (MOD) method or a spin on glass (SOG) method is formed. This method performs, on the surface of the substrate, spin coating of a solution containing organic silicon molecules, and implements heat treatment thereon for one hour in an atmosphere of 430° C. A film thickness of the silicon oxide coating film 110 thus baked was 300 nm.

Moreover, by using, as a mask, a resist pattern fabricated by using a lithography method, the substrate 100 and the solid material 101 are immersed into an ammonium acetate-buffered hydrogen fluoride solution (BHF), and the silicon oxide coating film 110 is partially removed, whereby a contact hole 111 is formed. As illustrated in FIG. 11, the contact hole structure 111 is one in which dots with a diameter of approximately 20 μm are arranged at a pitch of 40 μm in a triangular lattice. This has an effect for preventing the film from being peeled off at the time of over etching by BHF. Hence, a shape of the contact hole structure 111 is not limited to the dot pattern, and a state just needs to be achieved in which contact holes of a size with an order of micrometers are partially formed. Moreover, the contact hole structure 111 is not arranged in the vicinity of an end of the pattern of the solid material 101 arranged immediately thereunder, or is not arranged in such a way as to protrude from the region of the pattern. This is also effective for preventing the peeling of the film.

Figure 12:
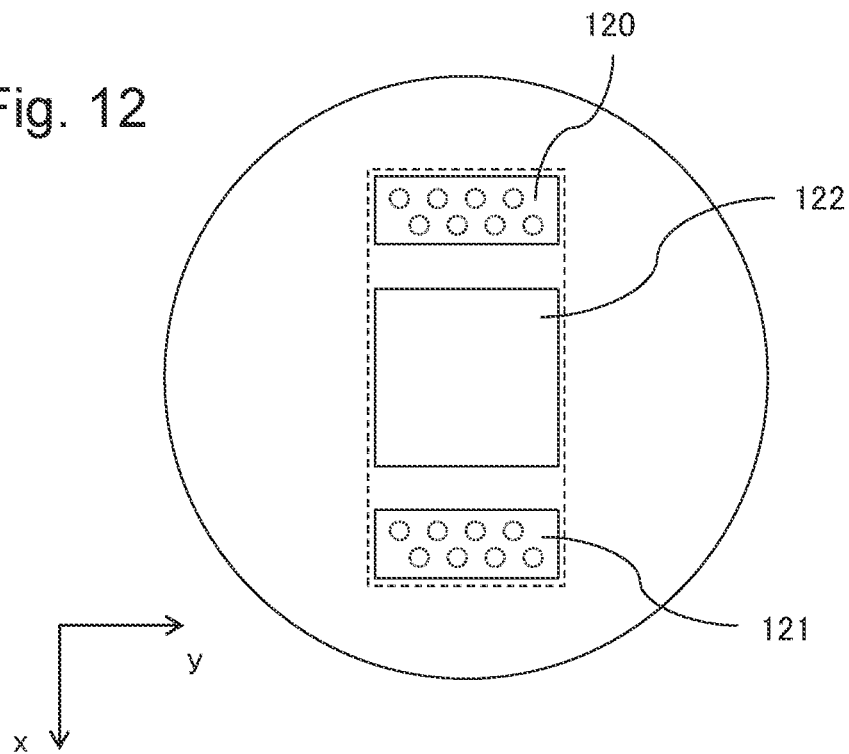
FIG. 12 is a schematic diagram illustrating contact pads and a heating element film, which are arranged on the insulating coating film of FIG. 11.

Finally, as illustrated in FIG. 12, contact pads 120 and 121 and a heating element film 122 are formed as in the first example embodiment, and an evaluating element structure is obtained.

In this modified example, the silicon oxide coating film can be formed without using a vacuum process, and accordingly, the steps of fabricating an element become simpler.

Second Modified Example of First Example Embodiment

Subsequently, referring to FIG. 13, a description will be given of a configuration of a second modified example of the thermoelectric conversion effect evaluation system of the first example embodiment.

This modified example relates to a method, at the time of measuring the spin-Seebeck effect and the anomalous Nernst effect which are magnetic thermoelectric conversion effects, of measuring the same while changing the direction of applying the magnetic field and the direction of applying the heat flow from those of the first example embodiment, and relates to an element structure.

Figure 13:
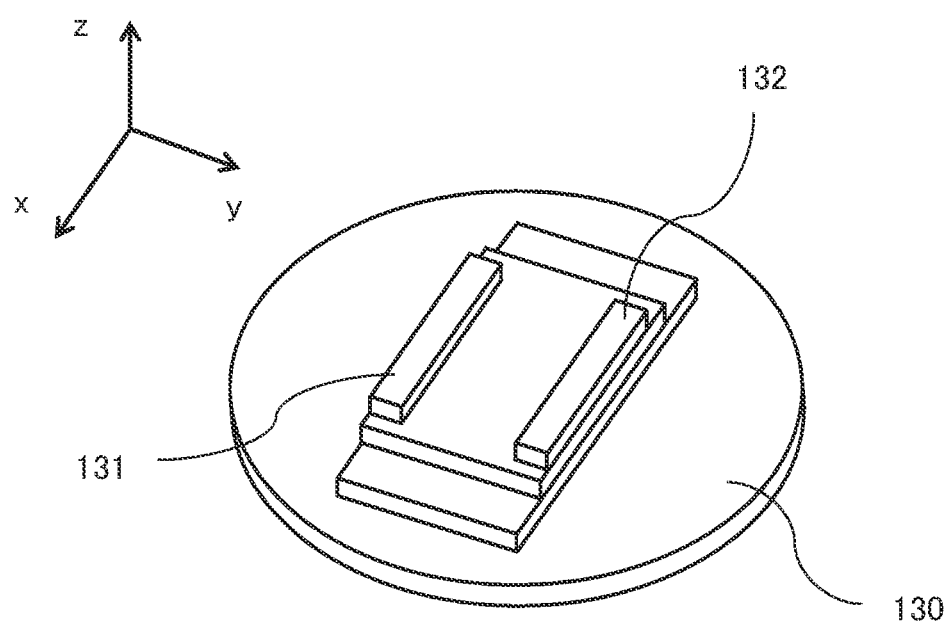
FIG. 13 is a schematic diagram illustrating arrangement of heating element films for evaluating a spin-Seebeck effect by applying an external magnetic field in a z-direction and applying a heat flow in a y-direction in a second modified example of the first example embodiment of the present invention.

In FIG. 13, on a glass substrate 130, there are provided a solid material 101 and a silicon oxide-made insulating coating film, which are similar to those described in the first modified example of the first example embodiment. Moreover, as the heating element films 131 and 132, two heating element films arranged only partially on the insulating coating film are provided.

The heating element films are arranged for the purpose of generating a temperature gradient in the +y-direction or the −y-direction in the plane of the solid material by implementing electric heating for only either one thereof.

Hence, as illustrated in FIG. 13, the heating element films are arranged in such a way as to cover most of two sides, which are parallel to the x-axis, among four sides of a rectangular shape formed by the solid material. Moreover, the heating element films are formed into such a linear shape that does not cover the inside of the rectangular shape as much as possible, thus making it possible to effectively generate a heat flow in the y-direction. With regard to the generation of a heat flow in the y-direction, it is important to make thermal conductivity of the substrate smaller than thermal conductivity of the solid material, and accordingly, a substrate material can be selected according to the type of the solid material. Moreover, as the film thickness of the solid material is thicker, and as the width thereof in the y-direction is smaller, a Signal to Noise Ratio (S/N ratio) in the measurement of the thermal electromotive force is enhanced, and accordingly, accuracy of the measurement can be enhanced by selecting an appropriate shape thereof. Effective use of both of the heating elements has an advantage that symmetry of the thermoelectric effect can be confirmed.

Moreover, though not illustrated in FIG. 13, an electromagnet system for applying an external magnetic field in ±z-axis directions, i.e., the plane-perpendicular direction may be provided. Theoretically, it becomes possible to apply a larger magnetic field in the plane-perpendicular direction in comparison with application of the in-plane magnetic field, which uses a leakage magnetic field method, and accordingly, provided is a configuration suitable for measuring a solid material having large holding force.

Third Modified Example of First Example Embodiment

Subsequently, referring to FIG. 3, a description will be given of a configuration of a third modified example of an evaluation device of a thermoelectric conversion effect according to the first example embodiment.

This modified example relates to a method of performing measurement by using a thermoelectric effect element as the heating element film 30, and relates to a structure of the element. In other words, the heating element film 30 is a heat flow generation element provided with a thermoelectric effect such as the Peltier effect, the spin Peltier effect, and the Ettingshausen effect, and is capable of heating and cooling a surface thereof in contact with the solid material depending on an orientation of a current to be energized to the heating element film 30.

The measurement can be performed while changing the orientation of the polarity of the heat flow generation, and accordingly, there are advantages that symmetry with regard to a heat flow symbol of the thermoelectric effect can be confirmed, that a parasitic effect and a signal can be confirmed, and that the S/N ratio can be improved.

Second Example Embodiment

First, referring to FIGS. 14 to 15, a description will be given of a configuration of an evaluation device of a thermoelectric conversion effect according to a second example embodiment.

Figure 14:
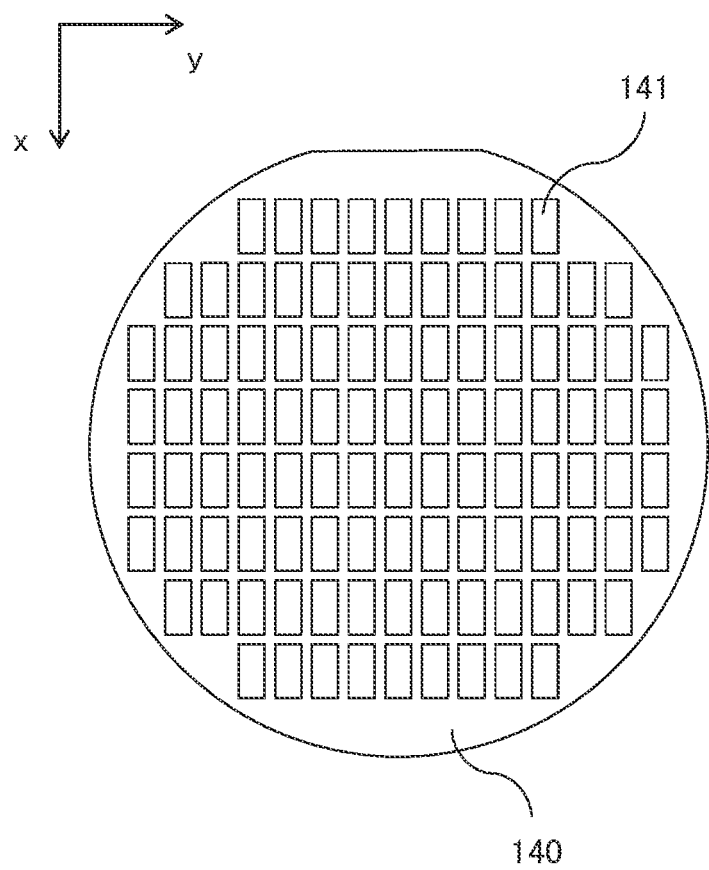
FIG. 14 is a schematic diagram illustrating a situation in which a plurality of solid materials are arranged on a substrate for use in a thermoelectric conversion effect evaluation system according to a second example embodiment of the present invention.
Figure 15:
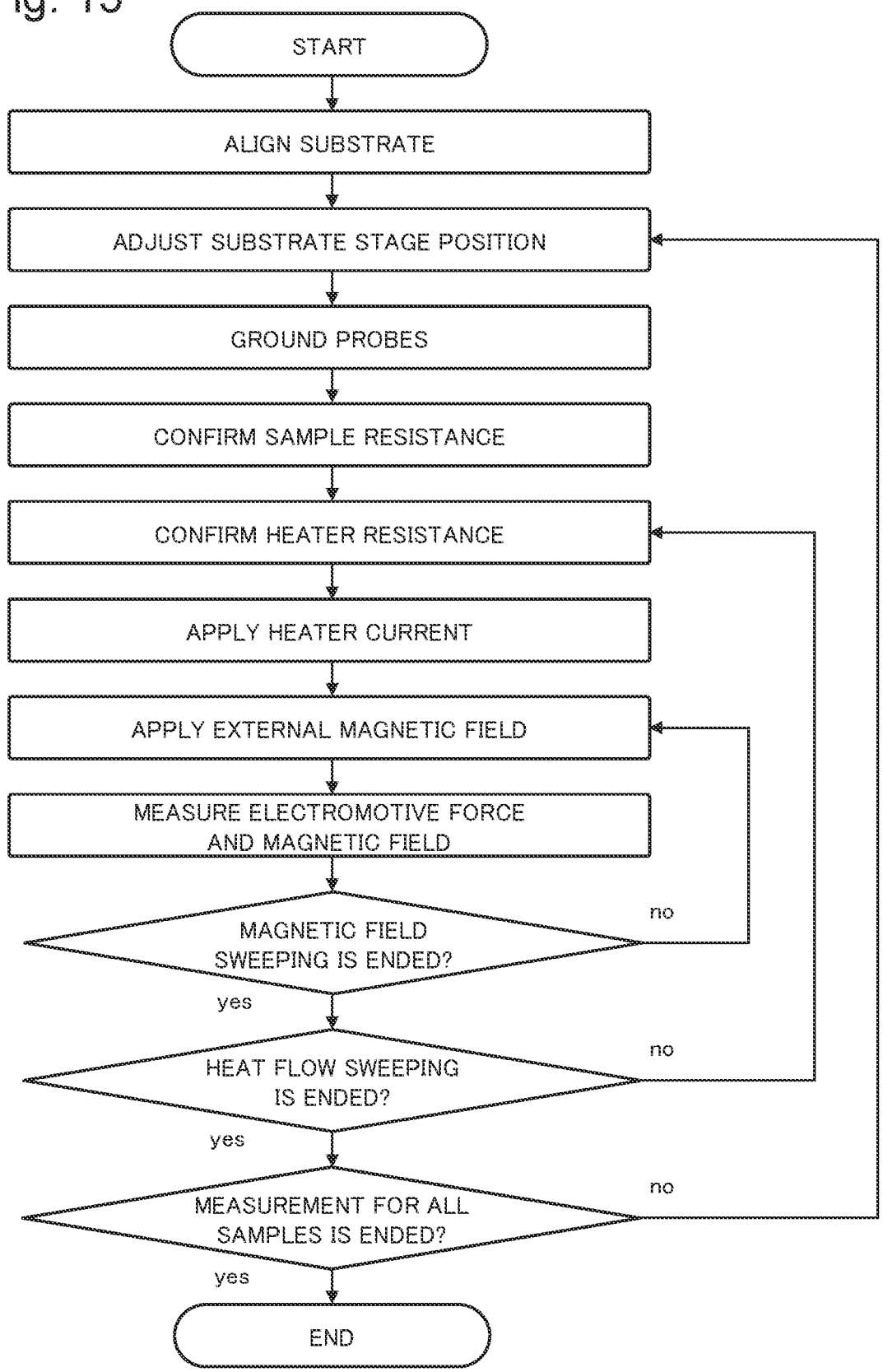
FIG. 15 is a flowchart illustrating a flow of a measurement process by the thermoelectric conversion effect evaluation system according to the second example embodiment of the present invention.

FIG. 14 is a schematic diagram illustrating a substrate 140 for use in a thermoelectric conversion effect evaluation system of the present example embodiment and an arrangement pattern of a plurality of permalloy thin films 141 serving as measurement targets.

The substrate 140 is a 3-inch silicon substrate with a plane orientation (100), to which a thermally oxidized silicon coating film with a thickness of 40 nm is attached, and the permalloy thin films 141 with a thickness of 100 nm were deposited thereon by using a sputtering deposition method. By using a stencil pattern, the permalloy thin films 141 are arranged in an array shape with a size of 2 mm×4 mm at a cycle of 2.2 mm×4.2 mm.

Subsequently, an oxide coating film and a heating element film are formed on each of the permalloy thin films 141 by using the method described in the first example embodiment, whereby an array-shaped group of evaluating element structures can be obtained.

Figure 4:
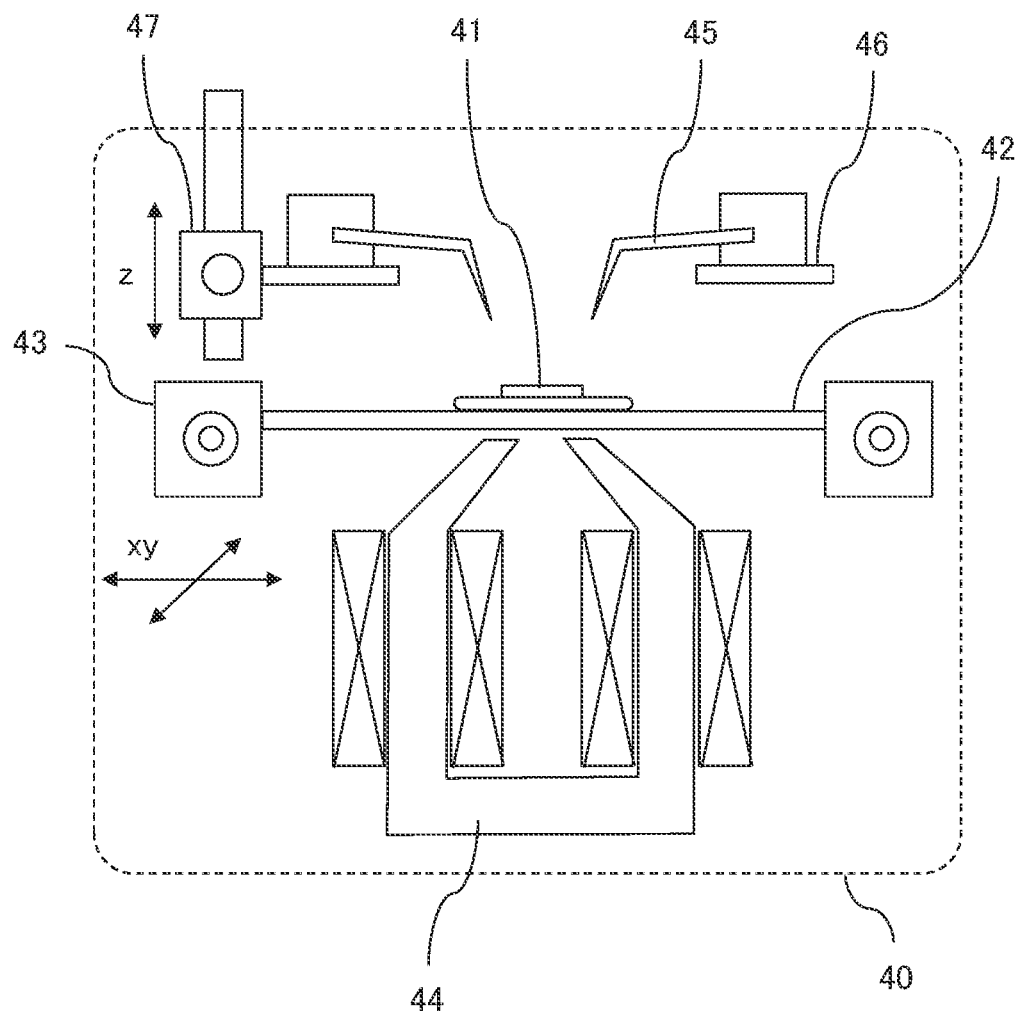
FIG. 4 is a schematic diagram illustrating an overview of the thermoelectric conversion effect evaluation system according to the first example embodiment of the present invention.

For measurement, the evaluation system illustrated in FIG. 4 is used effectively. A process of the measurement is performed along a flowchart illustrated in FIG. 15.

The substrate 140 is first fixed to the substrate stage 42 of the evaluation system of FIG. 4, and then performed is preparation for automatic measurement, such as adjustment of an origin point and alignment adjustment between the movable mechanism 43 of the stage and the xy-axes of such an element structure array on the substrate 140.

When a series of preparation steps is completed, positional adjustment of the substrate stage is automatically performed according to a list of positions of the evaluating elements on the substrate, the list being prepared in advance. Measurement after the above step is performed as in the flowchart of FIG. 5, and measurement for one evaluating element is completed by the fact that the measurement proceeds to the end of heat flow sweeping. Then, profiles of the external magnetic field dependence property and applied current dependence property of the thermal electromotive force as illustrated in FIG. 6 can be acquired.

Thereafter, measurements listed up in advance for the evaluating elements on the substrate are sequentially and automatically performed, whereby a group of data for the plurality of evaluating elements can be collectively acquired.

Figure 16:
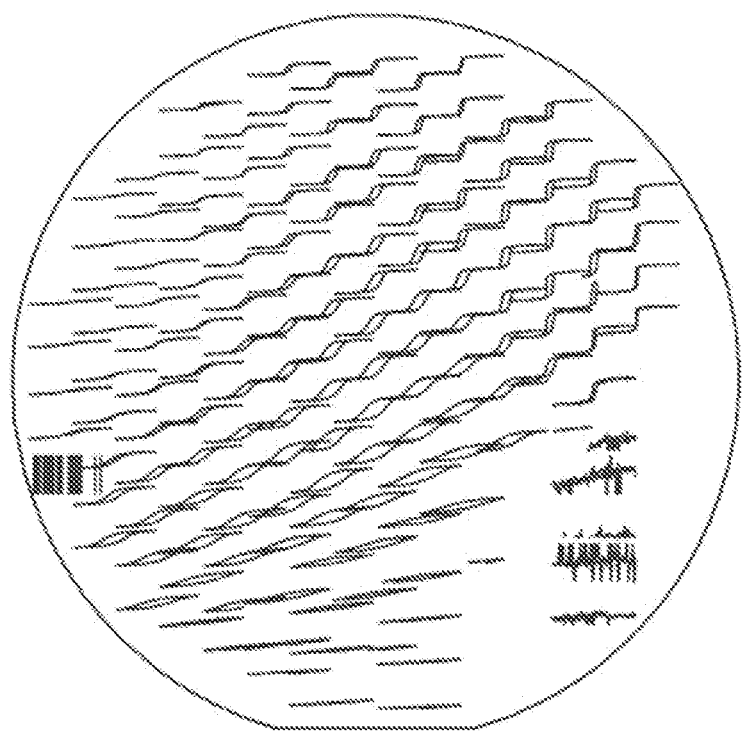
FIG. 16 is a diagram illustrating a result of evaluating an anomalous Nernst effect by the thermoelectric conversion effect evaluation system according to the second example embodiment of the present invention.

Generally, according to the method called a combinatorial deposition technique, it becomes possible to collectively deposit, on a substrate, materials different in composition from one another. Through use in combination with the present example embodiment, composition dependencies of the thermoelectric conversion coefficients can be further evaluated collectively, and such an evaluation result as illustrated in FIG. 16 is obtained. This is a technique that leads to an extremely great advantage from a viewpoint of increasing efficiency in exploring materials.

The whole or part of the example embodiments disclosed above can be described as, but not limited to, the following supplementary notes.

(Supplementary Note 1)

A physical property evaluation device that evaluates physical properties of a plurality of solid materials being formed on a substrate, the device including:

an electromotive force measurement means for forming a closed circuit including each of the solid materials and measuring electromotive force being generated on both ends of the solid material;

a heat flow generation means for generating a heat flow in each of the solid materials;

an external magnetic field generation means for generating a uniform magnetic field in a vicinity of each of the solid materials, the magnetic field having a given intensity and direction; and an automation means for evaluating a physical property of each of the solid materials by using the electromotive force measurement means, the heat flow generation means, and the external magnetic field generation means.

(Supplementary Note 2)

The physical property evaluation device according to supplementary note 1, wherein the heat flow generation means includes a heating element being firmly attached to a surface of the solid material.

(Supplementary Note 3)

The physical property evaluation device according to supplementary note 2, wherein the heat flow generation means further includes a means for supplying a heating element being firmly attached to a surface of the solid material with an amount of heat for heat generation.

(Supplementary Note 4)

The physical property evaluation device according to supplementary note 3, wherein the amount-of-heat supply means can be separated from a heating element.

(Supplementary Note 5)

The physical property evaluation device according to supplementary note 3, wherein the amount-of-heat supply means can be directly in contact with a heating element.

(Supplementary Note 6)

The physical property evaluation device according to supplementary note 2, wherein a heating element being included in the heat flow generation means includes an insulating coating film being firmly attached onto a surface of a solid material, and a conductor film being further firmly attached onto the insulating coating film.

(Supplementary Note 7)

The physical property evaluation device according to supplementary note 6, wherein a means for causing the conductor film to generate heat is Joule heat being generated by energizing a conductor film.

(Supplementary Note 8)

The physical property evaluation device according to supplementary note 6, wherein a means for causing the conductor film to generate heat is a thermoelectric effect being generated by energizing a conductor film.

(Supplementary Note 9)

The physical property evaluation device according to any one of supplementary notes 1 to 8, wherein, in the plurality of solid materials, at least one of a composition, a shape, and a deposition process condition in a material that constitutes each of the solid materials is different from that of other materials.

(Supplementary Note 10)
A physical property evaluating element including:
a plurality of patterns of solid materials, the patterns being formed on a substrate;
an insulating film being provided with contact holes being arranged in a triangular lattice, the insulating film being formed on each of the patterns;
a heater film being formed in a part on the insulating film, the part being other than the contact holes; and
a contact pad being formed on the contact holes.

(Supplementary Note 11)
The physical property evaluating element according to supplementary note 10, wherein the contact holes are provided in the insulating film in a vicinity of an end of each of the patterns without going beyond the pattern.

(Supplementary Note 12)
The physical property evaluating element according to supplementary note 10 or 11, wherein a plurality of the heater films are formed separately from one another on the insulating film.

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims.

This application claims priority based upon Japanese Patent Application No. 2018-148127 filed on Aug. 7, 2018, the entire disclosure of which is incorporated herein by reference.

REFERENCE SIGNS LIST

10 Substrate
11 Permalloy thin film
20 Insulating coating film
30 Heating element film
40 Thermoelectric conversion effect evaluation system
41 Substrate
42 Substrate stage
43 Movable mechanism
44 Electromagnet system
45 Contact probe system
46 Probe stage
47 Movable mechanism
140 Substrate
101 Solid material
110 Silicon oxide coating film
111 Contact hole structure
120 Contact pad
121 Contact pad
122 Heating element film
130 Glass substrate
131 Heating element film
132 Heating element film
140 Substrate
141 Permalloy thin film

The invention claimed is:

1. A physical property evaluation device that evaluates a physical property of a solid material having a first end and a second end being formed on a substrate, the device comprising:
an electromotive force measurement unit that forms a closed circuit including the solid material, and measures an electromotive force being generated between the first end and the second end of the solid material;
a heat flow generation unit that generates a heat flow in the solid material;
an external magnetic field generation unit that generates a uniform magnetic field in a vicinity of the solid material, the magnetic field having a given intensity and direction; and
an automation unit that evaluates the physical property of the solid material by using the electromotive force measurement unit, the heat flow generation unit, and the external magnetic field generation unit.

2. The physical property evaluation device according to claim 1, wherein the heat flow generation unit includes a heating element being firmly attached to a surface of the solid material.

3. The physical property evaluation device according to claim 2, wherein the heat flow generation unit further includes an amount-of-heat supply unit that supplies the heating element being firmly attached to the surface of the solid material with an amount of heat for heat generation.

4. The physical property evaluation device according to claim 3, wherein the amount-of-heat supply unit can be separated from the heating element.

5. The physical property evaluation device according to claim 3, wherein the amount-of-heat supply unit can be directly in contact with the heating element.

6. The physical property evaluation device according to claim 2, wherein the heating element included in the heat flow generation unit includes an insulating coating film being firmly attached onto the surface of the solid material, and a conductor film being further firmly attached onto the insulating coating film.

7. The physical property evaluation device according to claim 6, wherein heat in the conductor film is Joule heat being generated by energizing the conductor film.

8. The physical property evaluation device according to claim 6, wherein heat in the conductor film is a thermoelectric effect being generated by energizing the conductor film.

9. A physical property evaluation device that evaluates physical properties of a plurality of solid materials each having a first end and a second end being formed on a substrate, the device comprising:
an electromotive force measurement unit that forms a closed circuit including each of the solid materials of the plurality of solid materials, and measures an electromotive force being generated between the first end and second end of each of the plurality of solid materials;
a heat flow generation unit that generates a heat flow in each of the solid materials of the plurality of solid materials;
an external magnetic field generation unit that generates a uniform magnetic field in a vicinity of each of the solid materials of the plurality of solid materials, the magnetic field having a given intensity and direction; and
an automation unit that evaluates a physical property of each of the solid materials of the plurality of solid materials by using the electromotive force measurement unit, the heat flow generation unit, and the external magnetic field generation unit,
wherein, in the plurality of solid materials, at least one of a composition, a shape, or a deposition process condition in a material that constitutes each of the solid materials of the plurality of solid materials is different from that of other materials.

10. The physical property evaluation device according to claim 9, wherein the heat flow generation unit includes a heating element being firmly attached to a surface of each of the solid materials of the plurality of solid materials.

11. The physical property evaluation device according to claim 10, wherein the heat flow generation unit further includes an amount-of-heat supply unit that supplies the heating element being firmly attached to the surface each of the solid materials of the plurality of solid materials with an amount of heat for heat generation.

12. The physical property evaluation device according to claim 11, wherein the amount-of-heat supply unit can be separated from the heating element.

13. The physical property evaluation device according to claim 11, wherein the amount-of-heat supply unit can be directly in contact with the heating element.

14. The physical property evaluation device according to claim 10, wherein the heating element included in the heat flow generation unit includes an insulating coating film being firmly attached onto the surface of each of the solid materials of the plurality of solid materials, and a conductor film being further firmly attached onto the insulating coating film.

15. The physical property evaluation device according to claim 14, wherein heat in the conductor film is Joule heat being generated by energizing the conductor film.

16. The physical property evaluation device according to claim 14, wherein heat in the conductor film is a thermoelectric effect being generated by energizing the conductor film.

\* \* \* \* \*